US005792379A

United States Patent [19]

Dai et al.

[11] Patent Number: 5,792,379
[45] Date of Patent: Aug. 11, 1998

[54] LOW-LOSS PZT CERAMIC COMPOSITION COFIRABLE WITH SILVER AT A REDUCED SINTERING TEMPERATURE AND PROCESS FOR PRODUCING SAME

[75] Inventors: Xunhu Dai; Donald W. Forst, both of Albuquerque, N. Mex.

[73] Assignee: Motorola Inc., Schaumburg, Ill.

[21] Appl. No.: 825,074

[22] Filed: Mar. 27, 1997

[51] Int. Cl.$^6$ .......................... C04B 35/49; C04B 35/491; H01L 41/04; H01L 41/08

[52] U.S. Cl. .......................... 252/62.9 PZ; 252/62.9 R; 501/134; 310/311

[58] Field of Search ...................... 252/62.9 R, 62.9 PZ; 501/134; 310/311

[56] References Cited

U.S. PATENT DOCUMENTS

| | | | |
|---|---|---|---|
| 3,963,631 | 6/1976 | Ouchi et al. | 232/62.9 |
| 4,970,182 | 11/1990 | Shirasaki | 501/134 |
| 4,985,381 | 1/1991 | Mori et al. | 501/136 |
| 5,116,643 | 5/1992 | Miller et al. | 427/126.3 |
| 5,204,031 | 4/1993 | Watanabe et al. | 264/63 |
| 5,204,301 | 4/1993 | Ohkubo et al. | 501/136 |
| 5,403,788 | 4/1995 | Nishida et al. | 501/32 |
| 5,430,344 | 7/1995 | Takeuchi et al. | 310/330 |
| 5,461,014 | 10/1995 | Chu et al. | 501/135 |

*Primary Examiner*—Melissa Bonner
*Attorney, Agent, or Firm*—Gary J. Cunningham; Colin M. Raufer

[57] ABSTRACT

A low loss piezoelectric ceramic composition cofirable with silver at a reduced sintering temperature and a process for producing the same is provided. The composition is a binary piezoelectric ceramic composition consisting of a main composition which is characterized by 95.0 to 99.5 weight percent of a system represented by a general formula $Pb(Zr_xTi_{1-x})O_3 + yMnO_2$ in which $0 \leq x \leq 1.0$ and $0.1 \leq y \leq 1.0$ wt. % The composition also contains 0.5 to 5.0 weight percent of an additive represented by a general formula $wB_2O_3 - xBi_2O_3 - yMeO - zCuO$ wherein w,x,y, and z are weight percentages of the respective components and $w+x+y+z=1$. In the composition, Me is one of the metals selected from a group consisting of Ca, Sr, Ba, Zn, and $0.01 \leq w \leq 0.15$, $0 \leq x \leq 0.80$, $0 \leq y \leq 0.60$ and $0 \leq z \leq 0.55$. Significantly, the piezoelectric ceramic composition is non-reactive with a silver electrode layer when cofired therewith at sintering temperatures of about 900° C.

16 Claims, No Drawings

LOW-LOSS PZT CERAMIC COMPOSITION COFIRABLE WITH SILVER AT A REDUCED SINTERING TEMPERATURE AND PROCESS FOR PRODUCING SAME

FIELD OF THE INVENTION

The present invention relates to PZT ceramic compositions and, more particularly, to a low-loss PZT ceramic composition cofirable with silver at a reduced sintering temperature and a process for producing the same.

BACKGROUND OF THE INVENTION

The low-temperature sintering of lead based piezoelectric ceramics has been studied extensively by those in the electronic materials industry. Through the addition of various frits, glass additives or softening agents, the sintering temperature of lead zirconate titanate (PZT) ceramics may be reduced from $\cong 1250°$ C. to $\cong 960°$ C. In general, the sintering temperature is reduced by doping the piezoelectric composition with low-melting oxides.

Reference is made to an article titled "Low-Temperature Sintering of Lead-Based Piezoelectric Ceramics" by Gui Zhilun et al., Department of Chemical Engineering, Tsinghua University, Bejing, China (J. Am. Ceram. Soc., 72[3] 486–91 (1989)). This article discusses how to reduce the sintering temperature of a PZT composition by the addition of a small amount of a lower melting frit, $B_2O_3$—$Bi_2O_3$—CdO, while maintaining desirable electrical properties. Although this article discusses hard (low-loss) PZT ceramic materials, the sintering temperature is still too high for large scale manufacturing of PZT ceramics cofirable with a pure silver electrode material. As such, this composition may be of limited use in a large scale production environment.

U.S. Pat. No. 5,433,917 issued Jul. 18, 1995 to Srivastava et al. teaches the manufacture of a morphotropic PZT ceramic composition having reduced sintering temperatures and a process for producing the same. In this patent, the PZT is sintered with an effective amount of an eutectic mixture of copper oxide (CuO) and an oxide of an alkaline earth metal, preferably barium oxide and/or strontium oxide, to reduce the sintering temperature of the PZT composition to about 1000° C.

Although this patent discusses the addition of CuO as part of the frit, it deals primarily with soft-PZT materials which typically have high loss characteristics and are typically not intended for use in high power applications. This patent also addresses only a very narrow field of compositions, namely morphotropic lead zirconium titanate (PZT) piezoelectric ceramic compositions, containing about 52% lead zirconate and 48% lead titanate.

Unfortunately, these compositions are of limited use in the large scale manufacture of piezoelectric ceramic products such as piezoelectric multilayer transformers where low-loss properties accompanied by moderate coupling capabilities are desirable. Foremost, a sintering temperature in the range of about 950° C. still poses major cofiring problems with conventional silver (Ag) compositions, which typically have a melting temperature of about 962° C., and which are used to form the electrode patterns in standard multilayer packages.

Potential problems during the sintering process may include, but are not limited to, silver-ceramic reactions at boundary layers, volatile silver vapor resulting in bubbles or trapped gases, uneven or incomplete shrinkage or densification, degradation of electrical properties, or delamination, all leading to possible product failure.

To combat these adverse effects of sintering so close to the melting point of Ag, many manufacturers have chosen to employ a silver-palladium (Ag-Pd) electrode composition. Ag-Pd compositions have a melting point which is dependent upon the Pd content in the composition. For example, a 90% Ag-10% Pd composition has a melting temperature of about 1020° C. Unfortunately, this higher temperature processing can become very expensive compared to the processing costs associated with pure Ag electrode compositions. Higher sintering temperatures necessitate the use of more expensive noble metals such as Pt, Pd, Au, or their alloys (which have higher melting points) as the internal electrode material. Thus, a lower sintering temperature PZT material may result in a substantial savings in the cost of electrode materials as well as a substantial savings in energy used in high temperature firing.

Another problem with the prior art compositions, which becomes significant from manufacturing perspective, is the choice of materials used as additives or dopants. Cadmium oxide, for example, requires special handling and processing requirements due to its hazardous nature. This material, along with other similar materials suggested by prior art patents, cannot be easily incorporated into state-of-the-art manufacturing production lines, operations, and facilities. Additionally, products sold in Europe may face certain restrictions on the use of cadmium content per certain regulatory guidelines such as ISO14000.

Still another problem with the prior art compositions is that the low-melting additions, which concededly decrease the sintering temperature, also may modify the properties of the ceramics, causing degradation of the electrical properties of the composition which render these compositions impractical for their intended purposes as low-loss devices.

A PZT ceramic composition which is cofirable with silver at a reduced sintering temperature of 900° C. or less, which is non-reactive with a silver electrode layer when cofired therewith, which can be fully densified at low temperatures, and which can maintain desired electrical properties of a low-loss PZT while also being adaptable to large scale manufacturing processes would be considered an improvement in the art.

DETAILED DESCRIPTION OF THE PREFERRED EMBODIMENT

The Main Composition

The main composition is denoted by the following formula:

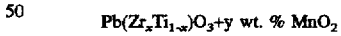

$$Pb(Zr_xTi_{1-x})O_3 + y \text{ wt. \% } MnO_2$$

in which $0 \leq x \leq 1$ and $0.1 \leq y \leq 1.0$ wt. % with a preferred embodiment approximately having y=0.3.

Magnesium dioxide ($MnO_2$) is a known metal oxide dopant used to reduce the dielectric losses in PZT ceramic compositions. The addition of about 0.1 to 1.0 weight percent $MnO_2$ to the main composition is also known to help for densification as well as enhance the mechanical quality factor ($Q_m$). The addition of a small amount of $MnO_2$ will increase $Q_m$. However, if too much $MnO_2$ is added to the main composition, then other electrical properties such as dielectric constant ($k^1$) or the coupling coefficients ($K_t$ & $K_p$) may be reduced to an unacceptable level. Also, the amount of $MnO_2$ should not be less than 0.1 or $Q_m$ will not be sufficiently increased. Conversely, the amount of $MnO_2$ should not be greater than 1.0 weight percent or $k^1$, $K_t$, and $K_p$ may be decreased to unacceptable levels.

An important feature of this invention is the low-temperature sinterability of the composition, which is achieved through a predetermined and specially formulated additive, and which can be applied over the entire PZT diagram. Stated another way, the sintering additive can be applied to zirconium/titanium (Zr/Ti) compositions having molar ratios from 100% zirconium/0% titanium to 0% zirconium/100% titanium (see Table 1G).

The aforementioned compositional flexibility is significant because different piezoelectric compositions are often required for different applications. For example, a Rosen-Type piezoelectric transformer application may require a composition with a Zr/Ti ratio close to the morphotropic phase boundary. On the other hand, for a high power/low turns ratio application such as a multilayer-stack piezoelectric transformer, a higher relative percentage of PbTiO3 as compared with PbZrO3 could be utilized. There will be considerably more Ti than Zr in this composition. Nevertheless, by incorporating a predetermined amount of additive into the composition, a low sintering temperature composition cofirable with pure Ag at about 900° C. may be provided.

The Additive

A glass additive having 0.5 to 5.0 weight percent of the main composition is added to the main composition to lower the sintering temperature of the resultant composition. The additive is represented by a general formula:

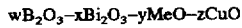

wherein w,x,y, and z are weight percentages of the respective components and w+x+y+z=1; wherein Me is one or more of the metals selected from a group consisting of Ca, Sr, Ba, Zn, and wherein $0.01 \leq w \leq 0.15$, $0 \leq x \leq 0.80$, $0 \leq y \leq 0.60$ and $0 \leq z \leq 0.55$. The additive is mixed with the main composition using conventional mixing techniques such as vibrational mixing and ball-milling.

The amount of additive incorporated into the main component has been limited to the ranges of 0.5 to 5.0 weight percent. If greater than 5.0 weight percent is added to the composition, then the electrical properties are degraded. If less than 0.5 weight percent is added, there will be insufficient densification at 900° C.

The first relevant ingredient present in the additive is boron oxide. Boron oxide ($B_2O_3$) helps to lower the melting temperature of the sintering additive and is used as a glass former. The content of $B_2O_3$ in the additive has been limited to those ranging from 0.01 to 0.15 for the following reasons. If the content of the $B_2O_3$ is less than 0.01, the melting point of the additive may be too high for complete densification of the PZT at 900° C. Conversely, if the content of the $B_2O_3$ exceeds 0.15, then degradation of electrical properties of the composition, such as dielectric loss, dielectric constant ($k'$), and the coupling coefficients $K_t$ and $K_p$, may occur. The $B_2O_3$ will always be present in the additive component of the present composition, along with at least two (2) of the three (3) other respective components.

Another ingredient in the additive is bismuth oxide. Bismuth oxide ($Bi_2O_3$) has a melting temperature of 825° C. The significance of this component is realized at the atomic level. The ionic radii of $Bi^{3+}$ and $Bi^{5+}$ are 0.96 Å and 0.74 Å, respectively, comparing to that of $Ti^{4+}$ (0.68 Å) and $Zr^{4+}$ (0.79 Å). Replacement of $Ti^{4+}$ and/or $Zr^{4+}$ by $Bi^{3+}$ and $Bi^{5+}$ ions is believed to result in the constraining of domain walls in the PZT grain due to the larger ionic radius of the replacement ions. This is believed to have the effect of reducing both dielectric and mechanical losses.

The content of the $Bi_2O_3$ in the additive has been limited to those ranging from 0 to 0.80 for the following reasons. If the content of the $Bi_2O_3$ exceeds 0.80, then the PZT is difficult to completely densify because it is postulated that the excess $Bi_2O_3$ exceeds the solubility limit of Bi into the PZT lattice structure in the given time domain of interest. Of course, if the $Bi_2O_3$ is not diffused into the PZT structure, the domain wall stabilization could be aided through the introduction of other metal oxide materials (MeO, where Me=Ca, Sr, Ba and Zn) into the sintering additive.

Metal oxide materials may also be strategically added, in small quantities, into the additive. The MeO (where Me=Ca, Sr, Ba and Zn) oxides in the additive are intended to replace part of the PbO in the PZT structure to stabilize domain walls in the PZT composition by introducing larger ionic radii elements into the crystal structure in the same manner as $Bi_2O_3$. For example, the ionic radii of $Ba^{2+}$ is 1.34 Å which is larger than that of $Pb^{2+}$ (1.20 Å). The content of MeO in the additive has been limited to those ranging from 0 to 0.60 for the following reasons. If the content of MeO exceeds 0.60, then the melting temperature of the additive is too high which results in poor densification of the PZT ceramics at 900° C. In addition, segregation of MeO in the PZT grain boundaries could degrade dielectric constant ($k'$) and coupling coefficients ($K_t$ and $K_p$) of the piezoelectric composition. If the MeO is not put in the mixture, then the adjustment of the piezoelectric properties would be achieved through the adjustment of the amounts of the other oxides in the additive. Thus, the addition of $Ba^{2+}$ ions, or any of the other specified metal ions, in the additive, may result in them being diffused into the main composition for improved properties.

CuO is known as a wetting agent in the additive which can enhance densification of PZT. By adding a small amount of CuO to the PZT composition, the mechanical quality factor ($Q_m$) is known to be enhanced while maintaining a relatively high dielectric constant ($k'$) and coupling coefficients. The content of CuO in the additive has been limited to those ranging from 0 to 0.55 for the following reasons. If the content of CuO exceeds 0.55, then high electrical losses could occur. If it is not put in the mixture, the densification of the PZT composition becomes a more difficult process at 900° C.

The process for preparing the fine powder of the piezoelectric ceramic composition according to the present invention comprises the steps of first independently preparing the main composition and the additive:

Preparation of the Main Composition

The main composition was prepared by a conventional mixed-oxide method using PbO, $ZrO_2$, $TiO_2$ and $MnO_2$ as raw materials. A mixture with the proper amount of each ingredient was wet-milled with a ball mill for 12 hours and then dried in an oven, (see Tables 1A–1G). The dried powder was then screened through a 40 mesh sieve and placed in an alumina crucible. Next, the powder was calcined at 850°–900° C. for 2–4 hours, then crushed and ground to prepare calcined powder having such a particle size that the particles could pass through a 100 mesh sieve.

Preparation of the Additive

The additive was prepared as follows. $H_3BO_3$, $Bi_2O_3$, $BaCO_3$, $CaCO_3$, $SrCO_3$, ZnO and CuO were used as raw materials for the preparation of the sintering additives. A mixture of the proper amount of each ingredient sufficient to make a batch size of about 100–400 grams was dry mixed for 12 hours. The mixture was then placed in a platinum (Pt) crucible and heated to melt at 1000°–1100° C. for 1–2 hours. The glass was quenched in water to form a glass frit. The frit was first ground using a mortar grinder (Glen Mill RM-0) and then milled with a vibration mill (Sweco) using $ZrO_2$ balls as media for 36–48 hours until a particle size of 1–4 um. was obtained. A preferred embodiment should have a particle size of about 1.5–2.0 um, in the composition.

Preparation of PZT Pellets for Electrical Test Measurements

Proper amounts of the main composition and the additive (per TABLES 1A–1G) were wet-milled with a vibrational mill for 12–16 hours and then dried in an oven. The dried powder was mixed with 1–3 wt % polyvinyl alcohol (PVA) and 0.5–1.5 wt % of polyethylene glycol (PEG). PZT pellets were formed from the composition using a uniaxial dry press at ~10000 PSI. Green (unfired) pellets were sintered at 900° C. for 3–6 hours.

The density of the sintered pellets were determined by the Archimedes Method. The fired pellets were sliced to a thickness ~0.4 mm and sputtered with gold (Edwards S150B) to form electrodes thereon. The electroded discs were then poled at 120° C. at an electric field 25–40 kV/cm for 5–10 minutes. The coupling coefficient ($d_{33}$) was measured using a Berlincourt meter to assure the samples were properly poled.

Measurement was performed on a computer-controlled Hewlett-Packard 4194A Impedance/Gain-Phase Analyzer. The measured parameters were: dielectric constant ($k^1$), dielectric loss factor (tan δ), mechanical quality factor ($Q_m$), thickness coupling coefficient ($K_t$), planar coupling coefficient ($K_p$), as well as density (measured in $g/cm^3$). These experimental results are provided in TABLES 1A through 1G, shown below:

TABLE 1A

Properties of $Pb(Zr_{0.52}Ti_{0.48})O_3$ + 0.3 wt % $MnO_2$ with $wB_2O_3$-$xBi_2O_3$-$zCuO$ sintering additives

| Sample number | Additive | w:x:z (weight fraction) | Weight (%) | Density (g/cm³) | $k^1$ (1 kHz) | tan δ (%) | $Q_m$ | $K_p$ | $K_t$ |
|---|---|---|---|---|---|---|---|---|---|
| 1 | BBiCu1 | 0.10:0.56:0.34 | 1 | 7.69 | 737 | 1.17 | 484 | 0.46 | 0.45 |
| 2 | | | 2 | 7.59 | 775 | 1.04 | 352 | 0.40 | 0.40 |
| 3 | | | 3 | 7.53 | 888 | 1.40 | 283 | 0.37 | 0.38 |
| 4 | | | 4 | 7.48 | 892 | 1.42 | 433 | 0.06 | 0.00 |
| 5 | BBiCu2 | 0.08:0.78:0.14 | 1 | 7.56 | 660 | 0.56 | 413 | 0.47 | 0.49 |
| 6 | | | 2 | 7.58 | 778 | 0.49 | 613 | 0.24 | 0.37 |
| 7 | | | 3 | 7.63 | 841 | 0.84 | 230 | 0.40 | 0.47 |
| 8 | | | 4 | 7.31 | 480 | 1.10 | 700 | 0.09 | 0.00 |
| 9 | BBiCu3 | 0.03:0.51:0.46 | 1 | 7.79 | 815 | 0.57 | 473 | 0.47 | 0.44 |
| 10 | | | 2 | 7.78 | 966 | 0.68 | 331 | 0.54 | 0.49 |
| 11 | | | 3 | 7.70 | 1103 | 0.57 | 269 | 0.55 | 0.53 |
| 12 | | | 4 | 7.69 | 887 | 1.17 | 266 | 0.53 | 0.51 |
| 13 | BBiCu4 | 0.02:0.73:0.25 | 1 | 7.78 | 703 | 1.02 | 352 | 0.51 | 0.51 |
| 14 | | | 2 | 7.78 | 584 | 0.81 | 200 | 0.49 | 0.48 |
| 15 | | | 3 | 7.73 | 650 | 0.83 | 317 | 0.52 | 0.51 |
| 16 | | | 4 | 7.71 | 514 | 0.84 | 295 | 0.35 | 0.36 |
| 17 | BBiCu5 | 0.01:0.57:0.42 | 0.25 | 7.41 | 605 | 0.50 | 611 | 0.38 | 0.44 |
| 18 | | | 0.50 | 7.83 | 620 | 1.03 | 630 | 0.47 | 0.45 |
| 19 | | | 0.75 | 7.85 | 661 | 0.73 | 568 | 0.50 | 0.44 |
| 20 | | | 1 | 7.88 | 580 | 0.64 | 448 | 0.47 | 0.44 |
| 21 | | | 2 | 7.85 | 572 | 0.63 | 234 | 0.51 | 0.60 |
| 22 | | | 3 | 7.78 | 545 | 0.59 | 388 | 0.52 | 0.50 |
| 23 | | | 4 | 7.75 | 540 | 0.88 | 263 | 0.45 | 0.46 |

TABLE 1B

Properties of $Pb(Zr_{0.52}Ti_{0.48})O_3$ + 0.3 wt % $MnO_2$ with $wB_2O_3$-$yMeO$-$zCuO$ sintering additives

| Sample number | Additive | w:y:z (weight fraction) | Weight (%) | Density (g/cm³) | $k^1$ (1 kHz) | tan δ (%) | $Q_m$ | $K_p$ | $K_t$ |
|---|---|---|---|---|---|---|---|---|---|
| 24 | | | 1 | 7.46 | 607 | 0.68 | 636 | 0.39 | 0.43 |
| 25 | BBaCu1 | 0.15:0.33:0.52 | 2 | 7.61 | 640 | 0.58 | 536 | 0.40 | 0.42 |
| 26 | | | 4 | 7.52 | 578 | 0.89 | 670 | 0.33 | 01.42 |
| 27 | | | 1 | <7.0 | | | | | |
| 28 | BBiCu3 | 0.13:0.57:0.30 | 2 | 7.14 | 686 | 2.10 | 242 | 0.36 | 0.51 |
| 29 | | | 4 | 7.34 | 480 | 1.10 | 456 | 0.28 | 0.39 |

TABLE 1C

Properties of $Pb(Zr_{0.52}Ti_{0.48})O_3 + 0.3$ wt % $MnO_2$ with $wB_2O_3$-$xBi_2O_3$-$yBaO$-$zCuO$ sintering additives

| Sample number | Additive | w:x:y:z (weight fraction) | Weight (%) | Density (g/cm³) | k¹ (1 kHz) | tan δ (%) | $Q_m$ | $K_p$ | $K_t$ |
|---|---|---|---|---|---|---|---|---|---|
| 30 | BBiBaCu1 | 0.09:0.61:0.20:0.10 | 1 | 7.51 | 670 | 0.69 | 456 | 0.42 | 0.45 |
| 31 | | | 2 | 7.30 | 873 | 0.31 | 400 | 0.44 | 0.47 |
| 32 | | | 3 | 7.32 | 785 | 0.65 | 384 | 0.32 | 0.45 |
| 33 | | | 4 | 7.34 | 790 | 0.39 | 346 | 0.23 | 0.28 |
| 34 | BBiBaCu2 | 0.11:0.38:0.25:0.26 | 1 | 7.52 | 653 | 1.26 | 639 | 0.35 | 0.41 |
| 35 | | | 2 | 7.60 | 713 | 1.08 | 606 | 0.38 | 0.39 |
| 36 | | | 3 | 7.46 | 603 | 0.99 | 346 | 0.31 | 0.45 |
| 37 | | | 4 | 7.47 | 718 | 0.83 | 431 | 0.32 | 0.40 |
| 38 | BBiBaCu3 | 0.04:0.48:0.32:0.16 | 1 | 7.15 | 536 | 1.06 | 536 | 0.39 | 0.40 |
| 39 | | | 2 | 7.46 | 494 | 0.54 | 494 | 0.42 | 0.55 |
| 40 | | | 3 | 7.72 | 623 | 1.42 | 623 | 0.37 | 0.48 |
| 41 | | | 4 | 7.68 | 514 | 0.90 | 514 | 0.44 | 0.50 |
| 42 | BBiBaC4 | 0.13:0.43:0.29:0.15 | 1 | 7.14 | 526 | 2.23 | 161 | 0.28 | 0.55 |
| 43 | | | 2 | 7.08 | 584 | 1.43 | 150 | 0.33 | 0.52 |
| 44 | | | 3 | 7.22 | 650 | 0.54 | 464 | 0.33 | 0.42 |
| 45 | | | 4 | 7.33 | 514 | 0.47 | 281 | 0.28 | 0.37 |
| 46 | BBiBaCu5 | 0.05:0.63:0.21:0.11 | 1 | 7.02 | | | | | |
| 47 | | | 2 | 7.24 | 567 | 1.93 | 165 | 0.34 | 0.58 |
| 48 | | | 3 | 7.35 | 536 | 0.87 | 160 | 0.39 | 0.54 |
| 49 | | | 4 | 7.50 | 521 | 0.51 | 205 | 0.37 | 0.49 |

TABLE 1D

Properties of $Pb(Zr_{0.52}Ti_{0.48})O_3 + 0.3$ wt % $MnO_2$ with $wB_2O_3$-$xBi_2O_3$-$yCaO$-$zCuO$ sintering additives

| Sample number | Additive | w:x:y:z (weight fraction) | Weight (%) | Density (g/cm³) | k¹ (1 kHz) | tan δ (%) | $Q_m$ | $K_p$ | $K_t$ |
|---|---|---|---|---|---|---|---|---|---|
| 50 | | | 1 | 7.35 | 650 | 0.75 | 276 | 0.42 | 0.51 |
| 51 | BBiCaCu | 0.11:0.69:0.08:0.12 | 2 | 7.32 | 735 | 0.46 | 337 | 0.45 | 0.51 |
| 52 | | | 3 | 7.40 | 820 | 0.77 | 223 | 0.33 | 0.48 |
| 53 | | | 4 | 7.43 | 560 | 0.62 | 520 | 0.16 | 0.32 |

TABLE 1E

Properties of $Pb(Zr_{0.52}Ti_{0.48})O_3 + 0.3$ wt % $MnO_2$ with $wB_2O_3$-$xBi_2O_3$-$ySrO$-$zCuO$ sintering additives

| Sample number | Additive | w:x:y:z (weight fraction) | Weight (%) | Density (g/cm³) | k¹ (1 kHz) | tan δ (%) | $Q_m$ | $K_p$ | $K_t$ |
|---|---|---|---|---|---|---|---|---|---|
| 54 | | | 1 | 7.27 | 612 | 1.70 | 370 | 0.39 | 0.47 |
| 55 | BBiSrCu | 0.10:0.65:0.14:0.11 | 2 | 7.52 | 675 | 0.55 | 400 | 0.48 | 0.49 |
| 56 | | | 3 | 7.44 | 656 | 0.51 | 290 | 0.40 | 0.43 |
| 57 | | | 4 | 7.57 | 710 | 0.72 | 280 | 0.35 | 0.40 |

TABLE 1F

Properties of $Pb(Zr_{0.52}Ti_{0.48})O_3 + 0.3$ wt % $MnO_2$ with $wB_2O_3$-$xBi_2O_3$-$yZnO$-$zCuO$ sintering additives

| Sample number | Additive | w:x:y:z (weight fraction) | Weight (%) | Density (g/cm³) | k¹ (1 kHz) | tan δ (%) | $Q_m$ | $K_p$ | $K_t$ |
|---|---|---|---|---|---|---|---|---|---|
| 58 | BBiZnCu1 | 0.06:0.60:0.20:0.14 | 1 | 7.43 | 580 | 1.21 | 653 | 0.35 | 0.42 |
| 59 | | | 2 | 7.62 | 630 | 1.55 | 625 | 0.38 | 0.42 |

TABLE 1F-continued

Properties of $Pb(Zr_{0.52}Ti_{0.48})O_3$ + 0.3 wt % $MnO_2$ with $wB_2O_3$-$xBi_2O_3$-$yZnO$-$zCuO$ sintering additives

| Sample number | Additive | w:x:y:z (weight fraction) | Weight (%) | Density (g/cm³) | $k^1$ (1 kHz) | tan δ (%) | $Q_m$ | $K_p$ | $K_t$ |
|---|---|---|---|---|---|---|---|---|---|
| 60 | | | 3 | 7.70 | 684 | 1.92 | 618 | 0.32 | 0.34 |
| 61 | | | 4 | 7.67 | 708 | 2.03 | 464 | 0.34 | 0.37 |
| 62 | BBiZnCu2 | 0.09:0.62:0.22:0.07 | 1 | 7.04 | 560 | 0.72 | 160 | 0.29 | 0.48 |
| 63 | | | 2 | 7.22 | 592 | 1.24 | 590 | 0.33 | 0.45 |
| 64 | | | 3 | 7.58 | 710 | 1.39 | 470 | 0.41 | 0.41 |
| 65 | | | 4 | 7.57 | 714 | 2.01 | 525 | 0.39 | 0.39 |
| 66 | BBiZnCu3 | 0.11:0.48:0.33:0.08 | 1 | 6.96 | 543 | 1.67 | 464 | 0.30 | 0.48 |
| 67 | | | 2 | 7.20 | 615 | 1.21 | 580 | 0.32 | 0.42 |
| 68 | | | 3 | 7.47 | 642 | 1.54 | 617 | 0.33 | 0.34 |
| 69 | | | 4 | 7.53 | 592 | 1.88 | 660 | 0.30 | 0.30 |
| 70 | BBiZnCu4 | 0.09:0.62:0.25:0.04 | 1 | 6.92 | 514 | 0.51 | 354 | 0.28 | 0.53 |
| 71 | | | 2 | 7.11 | 577 | 0.66 | 385 | 0.33 | 0.41 |
| 72 | | | 3 | 7.40 | 670 | 0.77 | 345 | 0.38 | 0.41 |
| 73 | | | 4 | 7.47 | 810 | 0.89 | 280 | 0.43 | 0.45 |
| 74 | BBiZnCu5 | 0.09:0.62:0.27:0.02 | 1 | 6.88 | 528 | 0.46 | 500 | 0.27 | 0.51 |
| 75 | | | 2 | 7.00 | 582 | 0.51 | 348 | 0.35 | 0.48 |
| 76 | | | 3 | 7.28 | 640 | 0.58 | 300 | 0.34 | 0.40 |
| 77 | | | 4 | 7.51 | 794 | 0.62 | 300 | 0.43 | 0.46 |
| 78 | BBiZn | 0.09:0.68:0.21:0.00 | 4 | 7.50 | 707 | 0.43 | 385 | 0.47 | 0.48 |

TABLE 1G

Properties of $Pb(Zr_xTi_{1-x})O_3$ + 0.3 wt % $MnO_2$ with BBiCu3 sintering additives

| Sample number | Main PZT Zr/Ti | Additive | Weight (%) | Density (g/cm³) | $k^1$ (1 kHz) | tan δ (%) | $Q_m$ | $K_p$ | $K_t$ |
|---|---|---|---|---|---|---|---|---|---|
| 79* | 100/0 | BBiCu3 | 1 | 7.86 | 140 | 3.40 | N/A | N/A | N/A |
| 80 | 90/10 | BBiCu3 | 1 | 7.78 | 191 | 2.32 | 2190 | 0.08 | 0.40 |
| 81 | 55/45 | BBiCu3 | 1 | 7.78 | 480 | 0.83 | 510 | 0.44 | 0.45 |
| 82 | 52/48 | BBiCu3 | 1 | 7.79 | 815 | 0.57 | 473 | 0.47 | 0.44 |
| 83 | 50/50 | BBiCu3 | 1 | 7.64 | 893 | 0.59 | 511 | 0.42 | 0.43 |
| 84 | 50/50 | BBiCu3 | 2 | 7.73 | 780 | 0.75 | 615 | 0.40 | 0.46 |
| 85 | 45/55 | BBiCu3 | 1 | 7.43 | 454 | 0.46 | 1252 | 0.23 | 0.40 |
| 86 | 45/55 | BBiCu3 | 2 | 7.72 | 489 | 0.70 | 1347 | 0.23 | 0.34 |
| 87 | 40/60 | BBiCu3 | 1 | 7.58 | 359 | 0.52 | 1860 | 0.17 | 0.36 |
| 88 | 40/60 | BBiCu3 | 2 | 7.75 | 510 | 0.46 | 1302 | 0.22 | 0.45 |
| 89 | 20/80 | BBiCu3 | 1 | 7.33 | 163 | 0.78 | 2090 | 0.06 | 0.23 |
| 90 | 20/80 | BBiCu3 | 2 | 7.61 | 156 | 0.90 | 2298 | 0.06 | 0.31 |
| 91* | 0/100 | BBiCu3 | 1 | 7.84 | 130 | 1.2 | N/A | N/A | N/A |
| 92* | 0/100 | BBiCu3 | 2 | 7.70 | 64 | 1.1 | N/A | N/A | N/A |
| 93* | 1/100 | BBiCu3 | 3 | 7.66 | 59 | 1.2 | N/A | N/A | N/A |

*These samples cannot be poled at normal field and thus the electromechanical properties are unavailable From the ninety-three sample compositions that were produced, certain compositions proved to be useful as low-loss compositions cofirable with silver at a reduced sintering temperature. Certain of the compositions showed promise as potential materials for piezoelectric ceramic electronic components. Desirable properties included low-loss, high dielectric constant (k') and high coupling coefficients. Using these properties as selection criteria, useful compositions for the piezoelectric designer are realized. Various compositions are analyzed in Examples (1) through (7) shown below. The conducted research revealed that certain samples (discussed in Examples 1 through 7) exhibited the desirable electromechanical properties discussed above (low-loss, high k', high $K_p$ and $K_t$) while also meeting the compositional requirements of the main composition and the additive (discussed previously). These samples represent the preferred embodiment of the present invention and are claimed as such below.

The present invention will be understood more readily with reference to the following Examples (1) through (7) which describe in detail some of the compositions selected from the Tables 1A-1G above. These examples are intended to illustrate the invention only and should not be construed to limit the scope of the invention.

Example One

PZT52/48 with $wB_2O_3$-$xBi_2O_3$-$zCuO$ additives

Example One analyzed Table 1A. In general, high sintered density can be achieved with a relatively small amount of $wB_2O_3$-$xBi_2O_3$-$zCuO$ additives. For additive BBiCu5, even 0.5 wt % can density the PZT to >7.8 g/cm³ (Sample 18). By examining the content of $B_2O_3$ from BBiCu1 through BBiCu5, it appears that a decrease in the dielectric constant (k¹) reduces the dielectric loss without significantly affecting other properties in this additive system. Change of CuO content does not change dielectric and electromechanical properties substantially, however, less CuO in the additive does reduce the sintered density as seen in Sample 2. This also demonstrates the importance of CuO as a wetting agent for the densification of the PZT composition.

Several compositions in Table 1A are suitable for piezoelectric transformer applications. For example, Samples #9, #11, #21 and #22 all exhibit a combination of desirable electrical and mechanical properties. Sample #9 has relatively low dielectric loss factor 0.57% and a $Q_m$ value of 473. In addition, the coupling coefficients are sufficiently high for piezoelectric transformer applications. Compared to Sample #9, Sample #11 has a lower $Q_m$ of 270 but higher coupling coefficients. In addition, the dielectric constant of Sample #11 is much higher than that of Sample #9. Samples #21 and #22 have similar electromechanical properties as those of sample 11. Although Samples #21 and 22 have lower dielectric constants than Sample #11, all three samples have values that are acceptable for piezoelectric transformer applications.

Example Two

PZT52/48 with $wB_2O_3$–$yBaO$–$zCuO$ additives

Referring to Table 1B, in the $wB_2O_3$–$yBaO$–$zCuO$ additive configuration, the ratio of CuO to $Bi_2O_3$ is very important. A high CuO/Bi2O3 ratio (BBaCu1) can densify the PZT composition better as well as result in low dielectric loss compositions. In addition, the mechanical quality factor shows an improvement as the CuO/Bi2O3 ratio increases. High mechanical quality factor ($Q_m$) is achieved in the PZT compositions with BBaCu1 additive (Samples #24 through #26).

Considering the overall electrical and electromechanical properties, the composition of Sample #25 is a good candidate for piezoelectric transformer application.

Example Three

PZT52/48 with $wB_2O_3$–$xBi_2O_3$–$yBaO$–$zCuO$ additives

Example Three refers to Table 1C. The density of the PZT compositions with $wB_2O_3$–$xBi_2O_3$–$yBaO$–$zCuO$ sintering additives in general is low. Sample #31 shows a low dielectric loss factor of 0.31%, a $Q_m$ of 400 and a relatively high coupling coefficient ($K_p$). However, the density of Sample #31 is only 7.30 g/cm³. Thus, samples combining high density and low losses suitable for piezoelectric transformer applications have not been identified in this compositional series (Table 1C).

Example Four

PZT52/48 with 11 wt % $B_2O_3$–69 wt % $Bi_2O_3$–8 wt % CaO–12 wt %CuO additives Example Four refers to Table 1D. Relatively low sintered density was obtained in this compositional series. However, Sample #51 still shows promising properties such as high coupling, moderate $Q_m$, and low dielectric loss. If the density could be improved without degrading the properties, for example, by reducing the particle size of starting powder, this the composition of Sample #51 may be suitable for certain piezoelectric transformer applications.

Example Five

PZT52/48 with 10 wt %$B_2O_3$–65 wt %$Bi_2O_3$–14 wt %SrO-11 wt %CuO additives

Example Five refers to Table 1E. In general, properties of this compositional series are similar to those PZT compositions with 11 wt %$B_2O_3$–69 wt %$Bi_2O_3$–8 wt %CaO-12 wt %CuO additives (see Example Four above). Sample #55 may be suitable for piezoelectric transformer applications if a higher sintered density could be achieved.

Example Six

PZT52/48 with $wB_2O_3$–$xBi_2O_3$–$yZnO$–$zCuO$ additives

Example Six refers to Table 1F. A higher mechanical quality factor $Q_m$ is achieved in compositions with several of the $wB_2O_3$–$xBi_2O_3$–$yZnO$–$zCuO$ additives, like BBiZnCu1 and BBiZnCu3 for example. However, the corresponding dielectric loss is also high. In this glass series, it appears that the dielectric loss of the fired PZT compositions decreases with decreasing CuO content. The dielectric loss reaches a minimum of 0.43% in Sample #78 which has no CuO in the sintering additive. On the other hand, the fired density of the compositions decreases with decreasing CuO content.

Example Seven $Pb(Zr_xTi_{1-x})O_3$+0.3 wt %$MnO_2$ with BBiCu3 sintering additives Example Seven refers to Table 1G. This compositional series demonstrates that PZT compositions over the entire Zr/Ti range (Zr/Ti from 100/0 to 0/100) could be densified using the unique sintering additive of the present invention. The BBiCu3 glass is used in this compositional series. A PZT composition with any Zr/Ti ratio can be densified to a density greater than 7.6 g/cm³ with a proper amount of the additive BBiCu1. There are many other additives within the invented $B_2O_3$–$Bi_2O_3$–MeO—CuO (Me=Ba, Sr, Ca or Zn) series which can also densify PZT compositions in the entire Zr/Ti range. In general, the additive which densifies PZT52/ 48+0.3 wt % $MnO_2$ can also be used to densify other PZT compositions containing other Zr/Ti ratios.

It is found that PZT with a Zr/Ti ratio of 52/48 is not the only composition suitable for piezoelectric transformer applications. Other Zr/Ti ratios near the morphotropic phase boundary (Zr/Ti=52/48) are also suitable for certain piezoelectric applications. For example, both Sample #81, in which Zr/Ti=55/45, and Sample #84, in which Zr/Ti=50/50, have relatively low dielectric loss values, high $Q_m$ and high coupling coefficients. Sample #81 is known to have a rhombohedral structure and thus has the additional advantage of being easily polarized. Thus, Sample #81 may prove useful for a piezoelectric transformer applications.

PZT compositions with a Zr/Ti ratio far away from the morphotropic phase boundary (Zr/Ti=52/48), e.g., rhombohedral-structured Samples #80 and tetragonal-structured Samples #87–90, are also found to have a very high mechanical quality factor $Q_m$. In addition, for samples numbered 87 through 90, the thickness coupling coefficient $K_t$ is much higher than the planer coupling coefficient $K_p$. As such, these compositions are particularly desirable for the step-up or step-down Stack piezoelectric transformer applications since the interference the high order planer resonant mode to the fundamental thickness resonant mode can be dramatically reduced.

The present invention utilizes liquid phase sintering to provide a piezoelectric material that may be sintered at temperatures of about 900° C. In liquid phase sintering, as opposed to solid state sintering, the viscosity of the glass allows complete densification to occur at lower temperatures and over a shorter period of time. A significant challenge of liquid phase sintering is maintaining desirable electrical properties while still lowering the temperature at which densification occurs. This is achieved by introducing a low melting temperature oxide into the system and maximizing its diffusion into the main composition while minimizing the reformation of glass.

Piezoelectric ceramic materials are known to have a perovskite crystal lattice structure. A generic perovskite crystal structure is shown by the general formula $A^{2+}B^{4+}O_3$. The selection of certain materials in the formulation of these compositions results in changes to the crystal structure during sintering. For example, the incorporation of Bi results in $Bi^{3+}$ ions on the A-site and $Bi^{3+}$ and $Bi^{5+}$ ions on the B-site of the perovskite structured PZT. This results in improved properties during sintering.

Another important feature of the compositions of the present inventions are that the sintering additives can be incorporated directly into the PZT lattice to enhance certain electric and piezoelectric properties of the PZT composition. For example, a relatively high dielectric constant, high mechanical quality factor ($Q_m$), relatively high coupling factors and low dielectric loss properties may all be desirable for applications such as a piezoelectric transformer.

In one preferred embodiment of the present invention, the piezoelectric ceramic composition will be particularly suited for high-power, high-voltage piezoelectric applications. The desirable electrical properties include a low mechanical loss $Q_m$ of about 400 or more, a planar coupling coefficient $K_p$ of about 0.35 or more, a thickness coupling coefficient $K_t$ of about 0.40 or more, a density of about 7.4 g/cm$^3$ or more, a dielectric constant k' value of about 600 or more, and a tan $\delta$ factor of about 1% or less.

The composition of the present invention may be achieved by a conventional mixed-oxide process. Those skilled in the art will understand this to mean that various oxide powders are mixed, calcined, and fired to achieve a composition with the desired properties.

The internal electrodes of typical high-temperature fire multilayer piezoelectric devices typically comprise a silver palladium alloy, most preferably a 70% silver/30% palladium alloy or a 90% silver/10% palladium alloy. An important feature of the compositions of the present inventions are that they are custom formulated such that they can be used with a pure silver paste. The ability to cofire PZT compositions with pure silver paste at low temperatures is an important aspect of the present invention.

In summary, the present invention provides a PZT ceramic composition which is cofirable with silver at a reduced sintering temperature of 900° C. or less, and which is non-reactive with a silver electrode layer when cofired therewith. The present invention can be fully densified at low temperatures, and can maintain desired electrical properties of a low-loss PZT while also being adaptable to large scale manufacturing processes. The piezoelectric ceramic composition of the present invention is cadmium-free because cadmium oxide requires special handling and processing requirements due to its hazardous nature (see Background of the Invention). The piezoelectric composition may be further processed to produce specific components such as a multilayered ceramic transformer device, for example. The piezoelectric ceramic composition may be cofired with silver electrode layers at a temperature of about 900° C. and, due to the properties of the composition, the electrode layers are non-reactive with the piezoelectric ceramic composition. One typical application for this piezoelectric ceramic composition may be a piezoelectric transformer used in a high voltage application wherein the voltage breakdown is about 50 kv/cm or more.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A binary piezoelectric ceramic composition consisting of a main composition which is characterized by 95.0 to 99.5 weight percent of a system represented by a general formula:

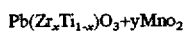
$Pb(Zr_xTi_{1-x})O_3 + yMnO_2$ in which $0 \leq x \leq 1.0$ and $0.1 \leq y \leq 1.0$ wt. %;

and 0.5 to 5.0 weight percent of an additive represented by a general formula:

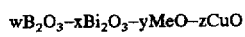
$wB_2O_3 - xBi_2O_3 - yMeO - zCuO$ wherein w,x,y, and z are weight percentages of the respective components and $w+x+y+z=1$ and w is non-zero and wherein two of x, y, and z are non-zero;

wherein Me is one of the metals selected from a group consisting of Ca, Sr, Ba, Zn, and wherein $0.01 \leq w \leq 0.15$, $0 \leq x \leq 0.80$, $0 \leq y \leq 0.60$ and $0 \leq z \leq 0.55$; wherein the piezoelectric ceramic composition is nonreactive with a silver electrode layer when cofired therewith at sintering temperatures of about 900° C.

2. The piezoelectric ceramic composition of claim 1, wherein the binary piezoelectric ceramic composition is cadmium-free.

3. The piezoelectric ceramic composition of claim 1, wherein the composition is a hard PZT ceramic.

4. The piezoelectric ceramic composition of claim 1, wherein the composition is produced by a conventional mixed-oxide process.

5. A binary piezoelectric ceramic composition consisting of a main composition which is characterized by 95.0 to 99.5 weight percent of a system represented by a general formula:

$Pb(Zr_{0.52}Ti_{0.48})O_3 + yMnO_2$ in which $0.1 \leq y \leq 1.0$ wt. %: and 0.5 to 5.0 weight percent of an additive represented by a general formula:

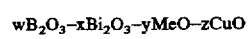
$wB_2O_3 - xBi_2O_3 - yMeO - zCuO$ wherein w,x,y, and z are weight percentages of the respective components and $w+x+y+z=1$ and w is non-zero and wherein two of x, y, and z are non-zero;

wherein Me is one of the metals selected from a group consisting of Ca, Sr, Ba, Zn, and wherein $0.01 \leq w \leq 0.15$, $0 \leq x \leq 0.80$, $0 \leq y \leq 0.60$ and $0 < z < 0.55$;

wherein the piezoelectric ceramic composition is nonreactive with a silver electrode layer when cofired therewith at sintering temperatures of about 900° C.

6. A piezoelectric transformer having a voltage breakdown of about 50 kv/cm or more produced from a binary piezoelectric ceramic composition consisting of a main composition which is characterized by 95.0 to 99.5 weight percent of a system represented by a general formula:

$Pb(Zr_xTi_{1-x})O_3 + yMnO_2$ in which $0<x<1O$ and $0.1<y<1.0$ wt. %;
and 0.5 to 5.0 weight percent of an additive represented by a general formula:

$wB_2O_3-xBi_2O_3-yMeO-zCuO$ wherein w,x,y, and z are weight percentages of the respective components and $w+x+y+z=1$ and w is non-zero and wherein two of x, y, and z are non-zero:
wherein Me is one of the metals selected from a group consisting of Ca, Sr, Ba, Zn, and
wherein $0.01<w<0.15$, $0<x<0.80$, $0<v<0.60$ and $0<z<0.55$; wherein the piezoelectric ceramic composition is nonreactive with a silver electrode layer when cofired therewith at sintering temperatures of about 900° C.

7. The piezoelectric ceramic composition of claim 1, wherein $Ba^{2+}$ ions are provided in the additive and diffuse into the main composition for improved properties.

8. The piezoelectric ceramic composition of claim 1, having the following properties:

mechanical loss ($Q_m$)=about 400 or more:
planar coupling coefficient ($K_p$)=about 0.35 or more:
thickness coupling coefficient ($K_t$)=about 0.40 or more:
density=7.4 g/cm³ or more:
dielectric constant (k')=about 600 or more: and
tan δ factor=about 1% or less.

9. A method of preparing a piezoelectric ceramic composition consisting of a main composition which is characterized by 95.0 to 99.5 weight percent of a system represented by a general formula:

$Pb(Zr_xTi_{1-x})O_3 + yMnO_2$ in which $0 \leq x \leq 1.0$ and $OO.1 \leq y \leq 1.0$ wt. %;
and 0.5 to 5.0 weight percent of an additive represented by a general formula:

$wB_2O_3-xBi_2O_3-yMeO-zCuO$ wherein w,x,y, and z are weight percentages of the respective components and $w+x+y+z=1$ and w is non-zero and wherein two of x, y, and z are non-zero;
wherein Me is one or more of the metals selected from a group consisting of Ca, Sr, Ba, Zn, and
wherein $0.01 \leq w \leq 0.15$, $0 \leq x \leq 0.80$, $0 \leq y \leq 0.60$ and $0 \leq z \leq 0.55$;
in a solid solution, the method comprising the steps of:
preparing a main composition by first mixing raw oxide materials;
wet-milling with a ball mill for 12 hours;
drying in an oven;
screening through a 40 mesh sieve;
calcining at 850°–900° C. for 2–4 hours;
pulverizing the powder such that the powder has a particle size that can pass through a 100 mesh sieve.
preparing an additive by first mixing raw materials;
heating to 1000°–1100° C. for 1–2 hours;
quenching in water to form a glass frit;
grinding the frit using a mortar grinder;
milling the frit using a vibration mill with ZrO2 balls as media for 36–48 hours until a particle size of 1–4 um is obtained;
combining the main composition and the additive in a wet-mill vibration mill for 12–16 hours;
drying the milled material to form the desired composition; and
sintering the milled material at 900° C. or less for 3–6 hours.

10. A piezoelectric ceramic composition made by the method of claim 9 and having the following properties:

density=7.4 g/cm³ or more
dielectric constant k'=600 or more
tan δ factor=1% or less
planar coupling coefficient $K_p$=0.35 or more
thickness coupling coefficient $K_t$=0.40 or more.

11. A method of preparing a piezoelectric ceramic composition consisting of a main composition which is characterized by 95.0 to 99.5 weight percent of a system represented by a general formula:

$Pb(Zr_xTi_{1-x})O_3 + yMnO_2$ in which $0<x<1.0$ and $OO.1<y<1.0$ wt. %:
and 0.5 to 5.0 weight percent of an additive represented by a general formula:

$wB_2O_3-xBi_2O_3-yMeO-zCuO$ wherein w,x y, and z are weight percentages of the respective components and $w+x+y+z=1$ and wherein w is non-zero and wherein two of x, y, and z are non-zero;
wherein Me is one or more of the metals selected from a group consisting of Ca, Sr, Ba, Zn, and
wherein $0.01<w<0.15$, $0<x<0.80$, $0<y<0.60$ and $0<z<0.55$;
in a solid solution, the method comprising the steps of:
preparing a main composition by first mixing raw oxide materials;
wet-milling with a ball mill for 12 hours;
drying in an oven;
screening through a 40 mesh sieve;
calcining at 850°–900° C. for 2–4 hours;
pulverizing the powder such that the powder has a particle size that can pass through a 100 mesh sieve.
preparing an additive by first mixing raw materials;
heating to 1000°–1100° C. for 1–2 hours:
quenching in water to form a glass frit;
grinding the frit using a mortar grinder;
milling the frit using a vibration mill with ZrO2 balls as media for 36–48 hours until a particle size of 1–4 um is obtained;
combining the main composition and the additive in a wet-mill vibration mill for 12–16 hours;
drying the milled material to form the desired composition;
sintering the milled material at 900° C. or less for 3–6 hours;

forming the piezoelectric ceramic composition into a tape; and cofiring the piezoelectric ceramic composition with a plurality of silver electrode layers at a temperature of about 900° C. wherein the plurality of silver electrode layers are non-reactive with the piezoelectric ceramic composition.

12. A multilayered piezoelectric element wherein the piezoelectric is a ceramic composition which is characterized by a general formula:

$$Pb(Zr_xTi_{1-x})O_3 + yMnO_2$$

in which $0 \leq x \leq 1.0$ and $0.1 \leq y \leq 1.0$ wt. %;

and 0.5 to 5.0 weight percent of an additive represented by a general formula:

$$wB_2O_3 - xBi_2O_3 - yMeO - zCuO$$

wherein w,x,y, and z are weight percentages of the respective components and w+x+y+z=1 and w is non-zero and wherein two of x, y, and z are non-zero;

wherein Me is one or more of the metals selected from a group consisting of Ca, Sr, Ba, Zn, and wherein $0.01 \leq w \leq 0.15$, $0 \leq x \leq 0.80$, $0 \leq 0.60$ and $0 \leq z \leq 0.55$.

13. The multilayered piezoelectric element of claim 12, wherein the ceramic composition is represented by a formula which is characterized by 99 weight percent of a system represented by the formula:

$$Pb(Zr_{0.52}Ti_{0.48})O_3 + 0.3 \text{ wt \%}MnO_2$$

and 1 weight percent of an additive represented by the formula:

3 wt %$B_2O_3$–51 wt %$Bi_2O_3$–46 wt %CuO.

14. The multilayered piezoelectric element of claim 12, wherein the ceramic composition is represented by a formula which is characterized by 99 weight percent of a system represented by the formula:

$$Pb(Zr_{0.55}Ti_{0.45})O_3 + 0.3 \text{ wt \%}MnO_2$$

and 1 weight percent of an additive represented by the formula:

3 wt %$B_2O_3$–51 wt %$Bi_2O_3$–46 wt % CuO.

15. The multilayered piezoelectric element of claim 12, wherein the ceramic composition is represented by a formula which is characterized by 98 weight percent of a system represented by the formula:

$$Pb(Zr_{0.52}Ti_{0.48})O_3 + 0.3 \text{ wt \%}MnO_2$$

and 2 weight percent of an additive represented by the formula:

15 wt %$B_2O_3$–33 wt %BaO-52 wt %CuO.

16. The multilayered piezoelectric element of claim 12, wherein the ceramic composition is represented by a formula which is characterized by 99 weight percent of a system represented by the formula:

$$Pb(Zr_{0.9}Ti_{0.1})O_3 + 0.3 \text{ wt \%}MnO_2$$

and 1 weight percent of an additive represented by the formula:

3 wt %$B_2O_3$–51 wt %$Bi_2O_3$–46 wt %CuO.

* * * * *